(12) United States Patent
Cho et al.

(10) Patent No.: US 9,070,891 B2
(45) Date of Patent: Jun. 30, 2015

(54) WHITE COLOR LIGHT OF ORGANIC LIGHT EMITTING DIODE

(75) Inventors: Ting-Yi Cho, New Taipei (TW); Po-Hsuan Chiang, New Taipei (TW); Wen-Huei Chen, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 151 days.

(21) Appl. No.: 13/477,073

(22) Filed: May 22, 2012

(65) Prior Publication Data
US 2013/0114238 A1    May 9, 2013

(30) Foreign Application Priority Data

Nov. 7, 2011 (TW) .............................. 100140564 A

(51) Int. Cl.
*H01L 51/50* (2006.01)
*H01L 51/00* (2006.01)

(52) U.S. Cl.
CPC ........... *H01L 51/504* (2013.01); *H01L 51/0059* (2013.01); *H01L 51/0072* (2013.01); *H01L 51/0085* (2013.01)

(58) Field of Classification Search
CPC .. H01L 61/504; H01L 51/504; H01L 51/5044
USPC ............................................ 257/40, E51.026
See application file for complete search history.

(56) References Cited

U.S. PATENT DOCUMENTS

2006/0105198 A1*    5/2006    Spindler et al. ............... 428/690

FOREIGN PATENT DOCUMENTS

TW    201011943    3/2010

OTHER PUBLICATIONS

Ho et al., "Recent Development of Organic Electrophosphorescent Materials and Phosphorescent OLED Device," Chemistry 63 (3), Sep. 2005, pp. 443-462 with English abstract at p. 462.
Zhang et al., "Organic Phosphorescent Electroluminescent Materials with Iridium Core," Progress in Chemistry 18 (7/8), Aug. 2006, pp. 870-882.
Yeh et al., "New Dopant and Host Materials for Blue Phosphorescent Organic Electroluminescent Devices," Advanced Materials 17, 2005, pp. 285-289.
Product of Luminescence Technology Corp., Jan. 20, 2010, Retrieved on May 16, 2012, from http://www.lumtec.com.cn/English/productdescr.asp?ArticleID=602.
"Office Action of Taiwan Counterpart Application", issued on Jan. 16, 2014, p. 1-p. 6.
Tokito et al., "High-efficiency white phosphorescent organic light-emitting devices with greenish-blue and red-emitting layers," Applied Physics Letters 83 (12), Sep. 22, 2003, pp. 2459-2461.
"First Office Action of China counterpart application" issued on Nov. 7, 2013, p. 1-p. 3.

* cited by examiner

*Primary Examiner* — Daniel Shook
(74) *Attorney, Agent, or Firm* — Jianq Chyun IP Office

(57) ABSTRACT

A white color light source of an organic light emitting diode is provided and is suitable for irradiating on plants. The white color light source includes a first color light and a second color light. A peak in the frequency spectrum of the first color light is within a first wavelength range. A peak in the frequency spectrum of the second color light is within a second wavelength range. The white color light source is at least formed by mixing the first color light and the second color light, wherein an intensity of a frequency spectrum of a wavelength range from 520 nm to 580 nm is substantially equal to or less than 20% of a total intensity of a frequency spectrum of the white color light source.

11 Claims, 3 Drawing Sheets

WHITE COLOR LIGHT OF ORGANIC LIGHT EMITTING DIODE

CROSS-REFERENCE TO RELATED APPLICATION

This application claims the priority benefit of Taiwan application serial no. 100140564, filed on Nov. 7, 2011. The entirety of the above-mentioned patent application is hereby incorporated by reference herein and made a part of this specification.

BACKGROUND OF THE INVENTION

1. Technical Field

The invention relates to a light source, and more particularly to a white color light source of an organic light emitting diode which is used for irradiating on plants.

2. Description of Related Art

In the plant growth process, irradiation is essential. Currently, manufacturers use artificial illumination system to provide sufficient and proper lights for plants, so as to accelerate the growth thereof or improve the quality thereof. For example, incandescent lamps, fluorescent lamps, light emitting diodes, or laser diodes have been used as illumination source for plant lighting. However, each of them is not faultless, and therefore application thereof is limited.

In detail, light emitting efficiency of the incandescent lamps and the fluorescent lamps is not high, and they may generate too much heat, which causes plants prone to be burned. In addition, since the incandescent lamps or the fluorescent lamps are point or line light sources, which are not planar light sources, the distance between the lamps and plants is increased for uniform irradiation. Therefore, disposition of the incandescent lamps or the fluorescent lamps occupies more space. Furthermore, each of these light sources has a certain frequency spectrum, and thus it is hard to adjust an intensity of a frequency spectrum of a specific wavelength according to properties of plants for accelerating the growth thereof. On the other hand, a planar-like light source may be formed by arranging the light emitting diodes or laser diodes in array, so that the distance between the light sources and plants can be reduced. However, driver module arranging in high density have drawbacks of complicated assembly and high heat generation, which cause reliability of the source system decreased.

SUMMARY OF THE INVENTION

The invention is directed to a white color light source of an organic light emitting diode, which can be efficiently absorbed and utilized by plants.

A white color light source of an organic light emitting diode is provided and is suitable for irradiating on plants. The white color light source includes a first color light and a second color light. A peak in a frequency spectrum of the first color light is within a first wavelength range. A peak in a frequency spectrum of the second color light is within a second wavelength range. The white color light source is at least formed by mixing the first color light and the second color light, wherein an intensity of a frequency spectrum of a wavelength ranging from 520 nm to 580 nm is substantially equal to or less than 20% of a total intensity of a frequency spectrum of the white color light source.

According to the invention, the white color light source of the organic light emitting diode is at least formed by mixing the first color light and the second color light, and the intensity of the frequency spectrum of the wavelength ranging from 520 nm to 580 nm is substantially equal to or less than 20% of the total intensity of the frequency spectrum of the white color light source. Since the frequency spectrum of the white color light source and the response frequency spectrum of plant photosynthesis are highly overlapped, the light source is efficiently absorbed and utilized by plants. Accordingly, plant growth is improved.

In order to make the aforementioned and other features and advantages of the invention more comprehensible, embodiments accompanying figures are described in detail below.

BRIEF DESCRIPTION OF THE DRAWINGS

The accompanying drawings, which are included to provide a further understanding of the disclosure and are incorporated on and constitute a part of this specification, illustrate embodiments of the invention and together with the description serve to explain the principles of the invention. In the drawings.

DETAILED DESCRIPTION OF DISCLOSED EMBODIMENTS

Figure 1A:
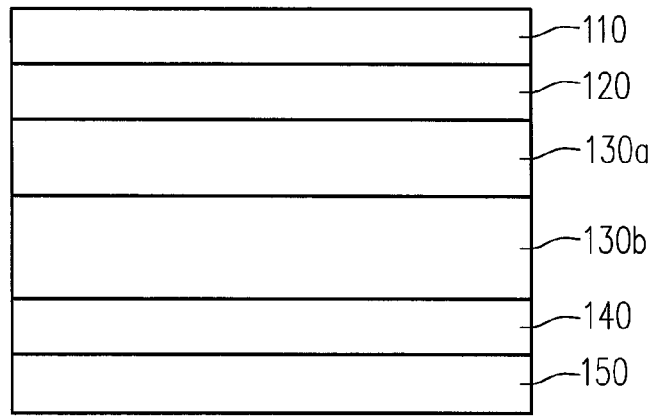
FIG. 1A is a schematic diagram showing an organic light emitting diode, which can be applied as a white color light source of an organic light emitting diode in accordance with an embodiment of the invention.

According to an embodiment of the invention, a white color light source of an organic light emitting diode is provided and is suitable for irradiating on plants. The white color light source includes a first color light and a second color light. A peak in a frequency spectrum of the first color light is within a first wavelength range. A peak in a frequency spectrum of the second color light is within a second wavelength range. In an embodiment, the first color light includes, for example, a blue light, and the first wavelength range is, for example, between 400 nm to 500 nm. In another embodiment, the first color light includes, for example, a pale blue light, and the first wavelength range is, for example, between 460 nm to 500 nm. In an embodiment, the second color light includes, for example, a red light, and the second wavelength range is, for example, between 610 nm to 700 nm e. In another embodiment, the second color light includes, for example, a red light, and the second wavelength range is, for example, between 610 nm to 640 nm. In yet another embodiment, the second color light includes, for example, a dark red light, and the second wavelength range is, for example, between 640 nm to 700 nm. Additionally, in an embodiment, the second color light can be a combination of a red light and a dark red light, and the second wavelength range is between 610 nm to 700 nm, for example.

The white color light source is at least formed by mixing the first color light and the second color light, wherein an intensity of a frequency spectrum of a wavelength ranging from 520 nm to 580 nm is substantially equal to or less than 20% of a total intensity of a frequency spectrum of the white color light source. Herein, the intensity of the frequency spectrum of the wavelength ranging from 520 nm to 580 nm is referred to a percentage of an area below the curve of the frequency spectrum of the wavelength ranging from 520 nm to 580 nm in the total area below the curve of the frequency spectrum of the white color light source. In other words, in this embodiment, the percentage of the area below the curve of the frequency spectrum of the wavelength ranging from 520 nm to 580 nm in the total area below the curve of the frequency spectrum of the white color light source is substantially equal to or less than 20%.

In an embodiment, the first light is, for example, a blue light, the second light is, for example, a red light, and the first light and the second light are mixed to form the white color light source. The first wavelength range is, for example, between 400 nm to 500 nm, and the second wavelength range is, for example, between 610 nm to 700 nm. In other words, according to this embodiment, there are at least two main peaks in the frequency spectrum of the white color light source, in which one main peak is, for example, between 400 nm to 500 nm, another main peak is, for example, between 610 nm to 700 nm, and the intensity of the frequency spectrum of the wavelength ranging from 520 nm to 580 nm is substantially equal to or less than 20% of the total intensity of the frequency spectrum of the white color light source.

In an embodiment, the first light is, for example, a pale blue light, the second light is, for example, a red light, and the first light and the second light are mixed to form the white color light source. The first wavelength range is, for example, between 460 nm to 500 nm, and the second wavelength range is, for example, between 610 nm to 640 nm. In other words, in the frequency spectrum of the white color light source of this embodiment, there are at least two main peaks, in which one main peak is, for example, between 460 nm to 500 nm, another main peak is, for example, between 610 nm to 640 nm, and the intensity of the frequency spectrum of the wavelength ranging from 520 nm to 580 nm is substantially equal to or less than 20% of the total intensity of the frequency spectrum of the white color light source.

In an embodiment, the first light is, for example, a pale blue light, the second light is, for example, a dark red light, and the first light and the second light are mixed to form the white color light source. The first wavelength range is, for example, between 460 nm to 500 nm, and the second wavelength range is, for example, between 640 nm to 700 nm. In other words, in the frequency spectrum of the white color light source of this embodiment, there are at least two main peaks, in which one main peak is, for example, between 460 nm to 500 nm, another main peak is, for example, between 640 nm to 700 nm, and the intensity of the frequency spectrum of the wavelength ranging from 520 nm to 580 nm is substantially equal to or less than 20% of the total intensity of the frequency spectrum of the white color light source.

FIG. 1A is a schematic diagram showing an organic light emitting diode, which can be applied as a white color light source of an organic light emitting diode in accordance with an embodiment of the invention. Referring to FIG. 1A, in the embodiment, an organic light emitting diode 100 includes a cathode layer 110, an electron transporting layer 120, a first organic light emitting layer 130a, a second organic light emitting layer 130b, a hole transporting layer 140, and an anode layer 150, which are sequentially disposed. In the embodiment, a material of the cathode layer 110 is, for example, aluminum, and a thickness thereof is, for example, 150 nm. A material of the electron transporting layer 120 is, for example, 4,7-diphenyl-1,10-phenanthroline(Bphen), and a thickness thereof is, for example, 15 nm. A material of the hole transporting layer 140 is, for example, TCTA, and a thickness thereof is, for example, 20 nm. A material of the anode layer 150 is, for example, indium tin oxide (ITO). In this embodiment, the organic light emitting diode 100 can further include a hole injection layer (not shown) and an electron injection layer (not shown), wherein the hole injection layer is disposed between the hole transporting layer 140 and the anode layer 150, and the electron injection layer is disposed between the electron transporting layer 120 and the cathode layer 110. In the embodiment, a material of the hole injection layer is, for example, m-MTDATA:$F_4$-TCNQ, and a thickness thereof is, for example, 110 nm. A material of the electron injection layer is, for example, Li-doped 4,7-diphenyl-1,10-phenanthroline(Bphen:Li), and a thickness thereof is, for example, 30 nm.

In this embodiment, the first organic light emitting layer 130a is, for example, used to emit the first color light, the second organic light emitting layer 130b is, for example, used to emit the second color light, and the white color light source is at least formed by mixing the first color light and the second color light. The intensity of the frequency spectrum of the wavelength ranging from 520 nm to 580 nm is substantially equal to or less than 20% of the total intensity of the frequency spectrum of the white color light source. In the embodiment, a material of the first organic light emitting layer 130a is, for example, pale blue phosphorescence material including mCP:FIrpic, and a thickness of the first organic light emitting layer 130a is, for example, 7.5 nm. The first color light is, for example, a pale blue light, the peak in the frequency spectrum of the first color light is, for example, between 460 nm to 500 nm, and the wavelength of the first color light is, for example, 474 nm. A material of the second organic light emitting layer 130b is, for example, red phosphorescence material including TCTA:Ir(btp)$_2$(acac), and a thickness of the second organic light emitting layer 130b is, for example, 20 nm. The second color light is a, for example, red light, the peak in the frequency spectrum of the second color light is, for example, between 610 nm to 640 nm, and the wavelength of the second color light is, for example, 620 nm.

Figure 1B:
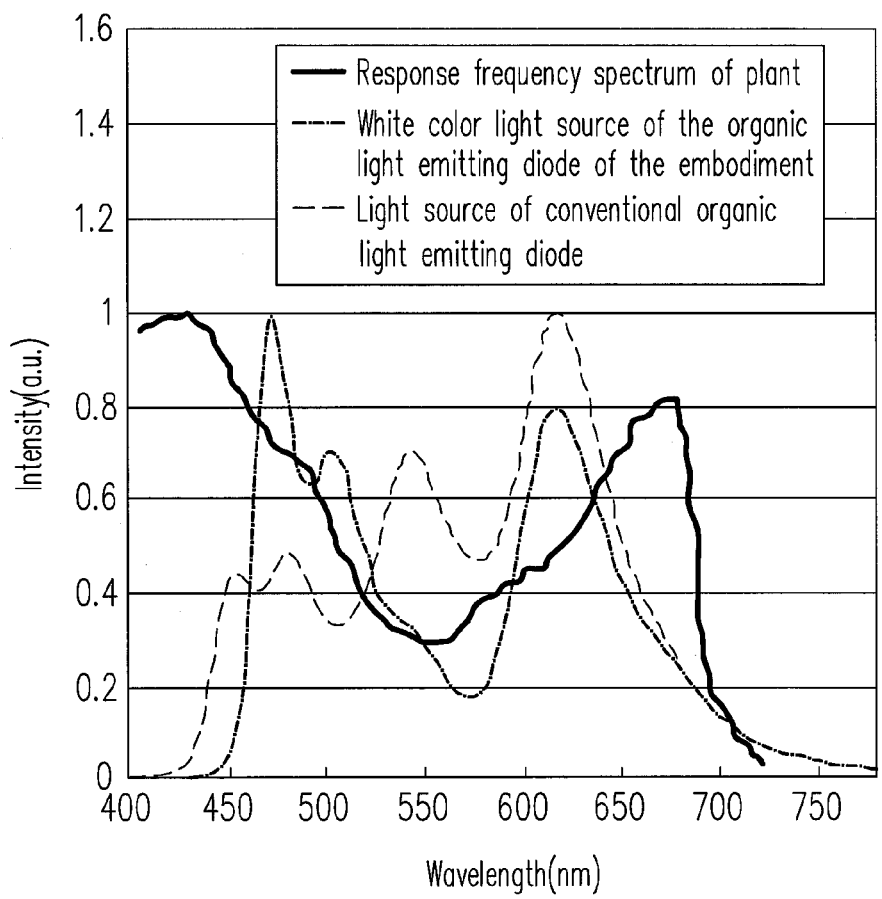
FIG. 1B is a diagram showing the relationship between the wavelength and the intensity in the frequency spectrum of the white color light source emitting from the organic light emitting diode of FIG. 1A, and the relationship between the wavelength and the intensity in the response frequency spectrum of plant photosynthesis, wherein voltage of the organic light emitting diode is 3.8V, brightness is 2000 nits, luminance is 5000 lux, power is 35~40 lm/W, and color temperature is 5000K.

FIG. 1B is a diagram showing the relationship between the wavelength and the intensity in the frequency spectrum of the white color light source emitting from the organic light emitting diode of FIG. 1A, and the relationship between the wavelength and the intensity in the response frequency spectrum of plant photosynthesis, wherein voltage of the organic light emitting diode is 3.8V, brightness is 2000 nits, luminance is 5000 lux, efficiency is 35~40 lm/W, and color temperature is 5000K. FIG. 1B further illustrates a frequency spectrum of a conventional organic light emitting diode currently used, to compare with the frequency spectrum of the white color light source emitting from the organic light emitting diode according to the embodiment. Referring to FIG. 1B, in the frequency spectrum of the white color light source of the embodiment, there are at least two main peaks. In detail, one main peak is, for example, provided by the first organic light emitting layer 130a, and between 460 nm to 500 nm and specifically at 474 nm. Another main peak is, for example, provided by the second organic light emitting layer 130b, between 610 nm to 640 nm and specifically at 620 nm, and the area below the curve of the frequency spectrum of the wavelength ranging from 520 nm to 580 nm is less than 20% of the total area below the curve of the frequency spectrum of the white color light source. Moreover, it is known that from FIG. 1B, compared with the frequency spectrum of the conventional organic light emitting diode currently used, the frequency spectrum of the white color light source of the embodiment and is highly overlapped with the response frequency spectrum of plant photosynthesis, and the intensity of the frequency spectrum of the wavelength ranging from 520 nm to 580 nm is reduced. Accordingly, the white color light source of the embodiment can be efficiently absorbed and utilized by plants, and thus plant growth is improved.

In this embodiment, an all-phosphor type organic light emitting diode is used as the white color light source, and is a planar light source with a broad frequency, a high light emitting efficiency, a low heat generation, a light weight and a thin thickness, and so on. Therefore, planar irradiation with large area and uniformity is obtained when it is used to irradiate plants. Moreover, since the organic light emitting diode is usually not over-heated, the white color light source thereof can irradiate plants at a short distance, so as to save space. Furthermore, according to the embodiment, the white color light source of the organic light emitting diode can be used without complicated assembly and driving circuit, and thus it has good reliability. In particular, the white color light source of the embodiment includes a frequency spectrum having multiplicity, and thus it can be adjusted depending on the properties of plants to optimize the irradiation condition for plant growth.

Figure 2A:
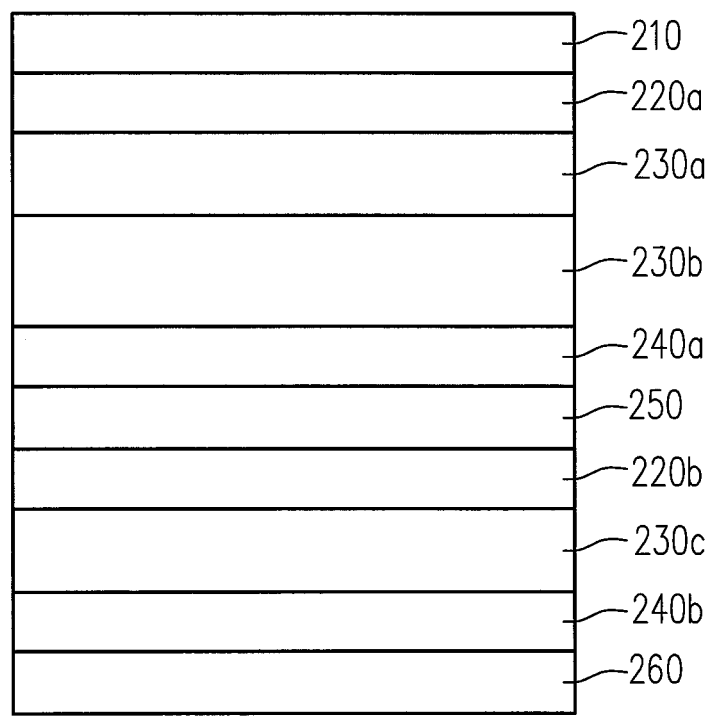
FIG. 2A is a schematic diagram showing an organic light emitting diode, which can be applied as a white color light source of an organic light emitting diode in accordance with an embodiment of the invention.

FIG. 2A is a schematic diagram showing an organic light emitting diode, which can be applied as a white color light source of an organic light emitting diode in accordance with an embodiment of the invention. Referring to FIG. 2A, in the embodiment, an organic light emitting diode 200 is, for example, a stacked-type organic light emitting diode, and includes a cathode layer 210, a first electron transporting layer 220a, a first organic light emitting layer 230a, a second organic light emitting layer 230b, a first hole transporting layer 240a, a charge generation layer 250, a second electron transporting layer 220b, a third organic light emitting layer 230c, a second hole transporting layer 240b, and an anode layer 260, which are sequentially disposed. The materials of the cathode layer 210, the electron transporting layers 220a, 220b, the hole transporting layers 240a, 240b and the anode layer 260 can be referred to the descriptions of the preceding embodiment and thus is not repeated here. It is particularly noted that, although the stacked-type organic light emitting diode is illustrated as FIG. 2A, but the invention is not limited thereto. In other words, the stacked-type organic light emitting diode having other configurations can be also applied as the white color light source of the organic light emitting diode of the invention.

In this embodiment, the first organic light emitting layer 230a is, for example, used to emit the first color light, the second organic light emitting layer 230b is, for example, used to emit the second color light, and the third organic light emitting layer 230c is, for example, used to emit a third color light. The white color light source is at least formed by mixing the first color light, the second color light, and the third color light, wherein the intensity of the frequency spectrum of the wavelength ranging from 520 nm to 580 nm is substantially equal to or less than 20% of the total intensity of the frequency spectrum of the white color light source. In the embodiment, a material of the first organic light emitting layer 230a is, for example, pale blue phosphorescence material including mCP:FIrpic. A thickness of the first organic light emitting layer 230a is 7.5 nm, for example. The first color light is, for example, a pale blue light, the peak in the frequency spectrum of the first color light is, for example, between 460 nm to 500 nm, and the wavelength of the first color light is, for example, 474 nm. A material of the second organic light emitting layer 230b is, for example, dark red phosphorescence material including TCTA:Ir(btp)$_2$(acac):PtOEP. A thickness of the second organic light emitting layer 230b is 20 nm, for example. The second color light is, for example, a dark red light, the peak in the frequency spectrum of the second color light is, for example, between 640 nm to 700 nm, and the wavelength of the second color light is, for example, 650 nm. A material of the third organic light emitting layer 230c is, for example, dark blue fluorescent material including MADN:DSA-Ph. A thickness of the third organic light emitting layer 230c is 25 nm, for example. The third color light is, for example, a dark blue light, the peak in the frequency spectrum of the third color light is, for example, between 400 nm to 460 nm, and the wavelength of the third color light is, for example, 460 nm. It is mentioned that, in an embodiment, a material of the second organic light emitting layer 230b can be also red phosphorescence material including PtOEp, the second color light is, for example, a red light, and the wavelength thereof is, for example, 610 nm to 640 nm.

Figure 2B:
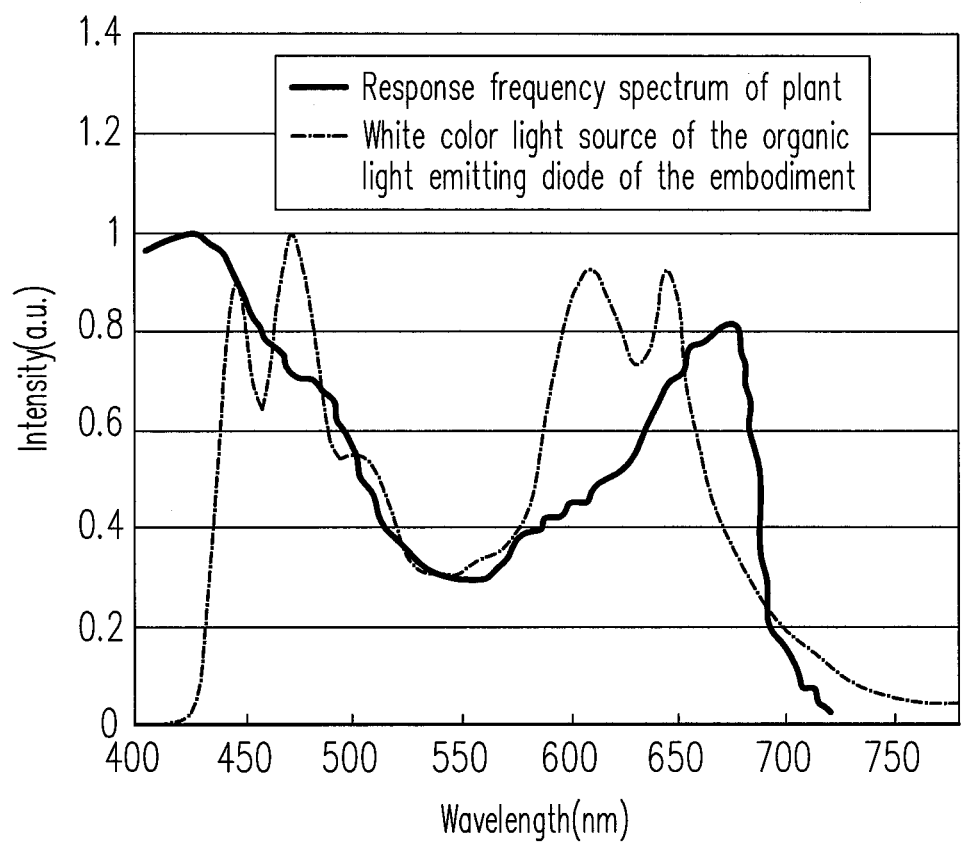
FIG. 2B is a diagram showing the relationship between the wavelength and the intensity in the frequency spectrum of the white color light source emitting from the organic light emitting diode of FIG. 2A, and the relationship between the wavelength and the intensity in the response frequency spectrum of plant photosynthesis, wherein voltage of the organic light emitting diode is 6.5V, brightness is 2000 nits, power is 30 lm/W, and color temperature is 5000K.

FIG. 2B is a diagram showing the relationship between the wavelength and the intensity in the frequency spectrum of the white color light source emitting from the organic light emitting diode of FIG. 2A, and the relationship between the wavelength and the intensity in the response frequency spectrum of plant photosynthesis, wherein voltage of the organic light emitting diode is 6.5V, brightness is 2000 nits, power is 30 lm/W, and color temperature is 5000K. Referring to FIG. 2B, in the frequency spectrum of the white color light source of the embodiment, there are at least four main peaks. In detail, one of the four main peaks is, for example, provided by the first organic light emitting layer 230a, and between 460 nm to 500 nm and specifically at 474 nm. Two of the four main peaks are, for example, provided by the second organic light emitting layer 230b, respectively between 610 nm to 640 nm and 640 nm to 700 nm, and specifically at 620 nm and 650 nm. The other one main peak is, for example, provided by the third organic light emitting layer 230c, and between 400 nm to 460 nm and specifically at 460 nm. Moreover, in the embodiment, the intensity of the frequency spectrum of the wavelength ranging from 520 nm to 580 nm is merely 12% of the total intensity of the frequency spectrum of the white color light source. In other words, the intensity of the frequency spectrum of the wavelength ranging from 520 nm to 580 nm is substantially less than 20% of the total intensity of the frequency spectrum of the white color light source. In addition, from FIG. 2B, it is known that the frequency spectrum of the white color light source of the embodiment and the response frequency spectrum of plant photosynthesis are highly overlapped, and thus the white color light source can be efficiently absorbed and utilized by plants. Accordingly, plant growth is improved.

In the stacked-type organic light emitting diode 200 of the embodiment, the first light emitting layer 230a and the second light emitting layer 230b are used as a light emitting unit, and the third light emitting layer 230c is used as another light emitting unit. In this embodiment, the first light emitting layer 230a and the second light emitting layer 230b are formed of phosphorescence materials, and the third light emitting layer 230c is formed of fluorescent materials, for example. In other words, the stacked-type organic light emitting diode can be formed by combining different illumination systems. In an embodiment, the stacked-type organic light emitting diode can also be constituted by same type illumination systems. Moreover, according to the embodiment, the white color light source of the organic light emitting diode is formed by mixing the first color light, the second color light, and the third color light, but the invention is not limited thereto. In other words, in other embodiments, the white color light source of the organic light emitting diode can be formed by more than three color lights as long as the intensity of the frequency spectrum of the wavelength ranging from 520 nm to 580 nm is substantially equal to or less than 20% of the total intensity of the frequency spectrum of the white color light source.

In an embodiment of the invention, the white color light source of the organic light emitting diode is at least formed by mixing the first color light and the second color light, and the intensity of the frequency spectrum of the wavelength ranging from 520 nm to 580 nm is substantially equal to or less than 20% of the total intensity of the frequency spectrum of the white color light source. The frequency spectrum of the white color light source and the response frequency spectrum of plant photosynthesis are highly overlapped, and thus the light source is efficiently absorbed and utilized by plants. Accordingly, plant growth is improved.

Particularly, the organic light emitting diode is used as the white color light source, and it is a planar light source with a broad frequency, a high light emitting efficiency, a low heat generation, a light weight and a thin thickness, and so on. Therefore, planar irradiation with a large area and uniformity is obtained when it is used to irradiate plants. Moreover, since the organic light emitting diode is usually not over-heated, the white color light source can irradiate plants at a short distance, so as to save space. Furthermore, the white color light source of the organic light emitting diode can be used without complicated assembly and driving circuit, and thus has good reliability. In particular, the white color light source of the invention includes a frequency spectrum having multiplicity, and thus it can be adjusted depending on the properties of plants to optimize the irradiation condition for plant growth.

Although the invention has been described with reference to the above embodiments, it will be apparent to one of the conventional skill in the art that modifications to the described embodiment may be made without departing from the spirit of the invention. Accordingly, the scope of the invention will be defined by the attached claims not by the above detailed descriptions.

What is claimed is:

1. An organic light emitting diode (OLED), emitting a white color light suitable for irradiating on plants, and comprising:
    a cathode;
    an anode;
    an electron transporting layer, disposed between the cathode and the anode;
    a hole transporting layer, disposed between the anode and the electron transporting layer;
    a first organic light emitting layer, disposed between the electron transporting layer and the hole transporting layer, and emitting a first color light, wherein a peak in a frequency spectrum of the first color light is within a first wavelength range;
    a second organic light emitting layer, disposed between the electron transporting layer and the hole transporting layer, and emitting a second color light, wherein a peak in a frequency spectrum of the second color light is within a second wavelength range; and
    a third organic light emitting layer, emitting a third color light, wherein a peak in a frequency spectrum of the third color light is within a third wavelength range, wherein the third color light comprising a dark blue light;
    wherein the white color light is used to irradiate plants so as to improve plant growth, and wherein the white color light is at least formed by mixing the first color light, the second color light and the third color light, an intensity of a frequency spectrum of a wavelength ranging from 520 nm to 580 nm is substantially equal to or less than 20% of a total intensity of a frequency spectrum of the white color light, the frequency spectrum of the white color light and the response frequency spectrum of plant photosynthesis are highly overlapped, and thus the white color light can be efficiently absorbed and utilized by plants.

2. The organic light emitting diode as claimed in claim 1, wherein the first color light comprises a blue light.

3. The organic light emitting diode as claimed in claim 1, wherein the first wavelength range is between 400 nm to 500 nm.

4. The organic light emitting diode as claimed in claim 3, wherein the first wavelength range is between 460 nm to 500 nm.

5. The organic light emitting diode as claimed in claim 1, wherein the second color light comprises a red light.

6. The organic light emitting diode as claimed in claim 1, wherein the second wavelength range is between 610 nm to 700 nm.

7. The organic light emitting diode as claimed in claim 6, wherein the second wavelength range is between 610 nm to 640 nm or 640 nm to 700 nm.

8. The organic light emitting diode as claimed in claim 1, wherein the first wavelength range is between 460 nm to 500 nm, and the second wavelength range is between 610 nm to 640 nm.

9. The organic light emitting diode as claimed in claim 1, wherein the first wavelength range is between 460 nm to 500 nm, and the second wavelength range is between 640 nm to 700 nm.

10. The organic light emitting diode as claimed in claim 1, wherein the first wavelength range is between 460 nm to 500 nm, the second wavelength range is between 640 nm to 700 nm, and the third wavelength range is between 400 nm to 460 nm.

11. The organic light emitting diode as claimed in claim 1, wherein the intensity of the frequency spectrum of the wavelength ranging from 520 nm to 580 nm is substantially equal to 12% of the total intensity of the frequency spectrum of the white color light.

* * * * *